United States Patent [19]

Sibuet

[11] Patent Number: 4,931,137
[45] Date of Patent: Jun. 5, 1990

[54] PROCESS FOR PRODUCING MUTUALLY SPACED CONDUCTOR ELEMENTS ON A SUBSTRATE

[75] Inventor: Henri Sibuet, Saint Egreve, France

[73] Assignee: Commissariat a l'Energie Atomique, Paris, France

[21] Appl. No.: 121,678

[22] Filed: Nov. 17, 1987

[30] Foreign Application Priority Data

Dec. 28, 1986 [FR] France .................. 86 16651

[51] Int. Cl.$^5$ .................. H01L 21/00; H01L 21/283; H01L 21/308
[52] U.S. Cl. .................. 156/656; 156/659.1; 156/664; 437/228; 437/246; 437/944
[58] Field of Search .................. 156/643, 656, 659.1, 156/664; 437/228, 245, 246, 924, 944, 984; 198/DIG. 25, DIG. 100, DIG. 111

[56] References Cited

U.S. PATENT DOCUMENTS

| | | | |
|---|---|---|---|
| 4,083,098 | 4/1978 | Nicholas | 357/24 X |
| 4,108,717 | 8/1978 | Widmann | 156/656 |
| 4,502,914 | 3/1985 | Trumpp et al. | 156/643 |
| 4,648,937 | 3/1987 | Ogura et al. | 156/643 |
| 4,784,718 | 11/1988 | Mitani et al. | 156/643 |

FOREIGN PATENT DOCUMENTS 0111086  6/1984  European Pat. Off. .
60-254733 12/1985  Japan .

OTHER PUBLICATIONS

Emmanuel, "Low Temperature Lift-Off Process" IBM TDB, vol. 24, No. 6, pp. 2964–2965, Nov. 1981.
Geelen et al., "Polyimide Lift Off for Submicrometer Metallisation Patterns", Microelectronic Engin., vol. 3, pp. 499–505, Dec. 1985.

Primary Examiner—Kenneth M. Schor
Assistant Examiner—Andrew J. Anderson
Attorney, Agent, or Firm—Pearne, Gordon, McCoy & Granger

[57] ABSTRACT

The invention relates to a process for producing on a substrate conductor elements which are mutually spaced by a submicron dimension.

This process comprises the stages of producing on substrate (1) spacers, whose dimensions and spacing are a function of the dimensions and spacing of the elements (11a) to be produced, anisotropic deposition on the substrate and perpendicular thereto of the material (11a) constituting the spacers and elimination of said spacers.

The invention applies to the production of any random elements and particularly to the production of slightly mutually spaced electric conductors.

4 Claims, 2 Drawing Sheets

PROCESS FOR PRODUCING MUTUALLY SPACED CONDUCTOR ELEMENTS ON A SUBSTRATE

DESCRIPTION

The present invention relates to a process for producing mutually spaced elements on a substrate.

The invention applies to the production of electric conductors on an insulating substrate, particularly for microelectronics, e.g. for the manufacture of magnetic recording heads in integrated technology, as described in EP-A-0 152 326 and EP-A-0 152 328.

In known manner, for producing elements such as electrical conductors spaced from one another on a substrate, on said substrate is e.g. deposited a layer of a conductive material, which is etched through a mask of appropriate patterns so as to obtain said conductors, or on the substrate and above the mask of appropriate patterns produced on the substrate is deposited the conductive material layer, the mask then being eliminated, taking with it those parts of the conductive material layer deposited on it.

No matter what process is used for producing these elements, it involves the use of a mask having geometrical patterns, whose dimensions are a function of those of the elements to be produced. Thus, for example, in the case where it is wished to produce slightly spaced elements, e.g. for microelectronics, the known processes must involve the production of masks having patterns with limited widths. The production of such masks becomes increasingly difficult as the widths decrease and drop below 1 micron.

Moreover in the production of submicron electronic structures, etching processes are already known using as the intermediate stage spacers in the form of very thin, small walls located perpendicular to the surface of a substrate on which the desired structure is produced.

For example, this is the case in the constructions described in EP-A-0 111 086 (particularly FIGS. 1B, 2B and 6) and JP-A-60 254 733 (FIGS. a, b, c, d, e and f). In these documents, the spacers are used for producing masks having particular shapes (cf. FIGS. 1C and 1D of EP-A-0 111 086 and FIGS. d and e of JP-A-60 254 733) by completely covering the spacers with the aid of the material constituting the mask and eliminating said spacers with the aid of a complimentary planarization stage of the structure making it possible the exposure and then the ablation of said spacers.

This prior art concerning the production of masks, particularly of photoresin masks and requiring a planarization stage which is not easy to be carried out with a conductive material, cannot provide a teaching to the Expert in connection with the deposition on a substrate of submicron mutually spaced conductor elements.

Nevertheless, the Applicant has unexpectedly found, that the procedure of producing spacers could, on associating it in a different way and in combination with anisotropic deposits, make it possible to produce on a substrate mutually spaced elements in such a way as to obviate the disadvantages of the prior art. In particular, it is possible to produce elements spaced by less than 1 $\mu$m.

More specifically, the invention relates to a process for producing mutually spaced elements on a substrate, characterized in that it comprises a first stage of producing spacers on the substrate which are perpendicular to the latter and whose dimensions and spacings are a function of the dimensions and spacing of the elements to be produced and in that on said substrate is effected an anisotropic deposit in a direction perpendicular to the substrate surface of at least a first material constituting the elements, so that the deposit produced on the heads of the spacers opposes the deposit of said same first conductive material on the walls of the spacers and then the latter are eliminated.

The term anisotropic deposit is understood to mean a deposit taking place in preferred manner in a preferred direction in space, i.e. in the case of the invention in a direction perpendicular to the substrate surface.

Advantageously the anisotropic deposits are effected by vacuum evaporation for instance with a vacuum of $10^{-4}$ Pascal ($10^{-6}$ Torr).

Thus, the inventive process utilizes per se known spacers in an entirely original and novel manner, which consists of associating them with an anisotropic deposit in a direction normal to the wall of the substrate and using the deposit on the heads of the spacers as a protective screen or shield for preventing the deposit from reaching the walls of the spacers.

Advantageously the spacers are eliminated by chemical etching.

With the inventive process, it is possible to produce elements spaced by less than 1 $\mu$m by producing spacers with a width of less than 1 $\mu$m.

Advantageously the spacers are produced by the stages of producing on the substrate a mask having geometrical patterns which are a function of the dimensions and spacing of the spacers to be produced, isotropic deposit over said mask of a layer of material constituting said spacers, anisotropic etching of the layer, so that all that is left of the deposit consists of those portions of the layer perpendicular to the plane of the substrate and located against the mask walls, the spacers being constituted by said parts and elimination of the mask.

The inventive process makes it possible to produce spacers with a width down to 0.3 $\mu$m.

Isotropic deposit is understood to mean a deposit taking place in all directions in space. This isotropic deposit has a thickness of the same order of magnitude as the width of the spacers to be produced.

Anisotropic deposit is understood to mean etching performed in preferred manner according to a preferred direction in space, i.e. in the case of the invention in a direction perpendicular to the substrate surface. The mask can be eliminated both by chemical etching and reactive ionic etching.

During anisotropic deposition on the substrate of the first material, if said deposit is not sufficiently directional, the first material can still be deposited on the base of the spacers. According to the invention, advantageously this is followed by an anisotropic deposition, perpendicular to the substrate, of a second material on the deposit of the first material, so that it covers the upper surface of the deposit of the first material and the latter is etched so as to at least eliminate it from the base of the spacers. This process stage makes it possible to free the base of the spacers from any material in order to facilitate the subsequent elimination of the spacers.

According to a preferred embodiment of the invention, with the elements being electrical conductors, the first material is conductive and the substrate insulating. When making a deposit of a second material, the latter can both be conductive and insulating, but in preferred manner a second conductive material is used for producing conductive elements.

Advantageously, the spacers are made from silica, the spacers then being eliminated e.g. by using a hydroflouric acid solution.

According to an embodiment, the mask is made by depositing a polymerizable resin layer in a thickness of the same order of magnitude as the height of the spacers to be produced, by polymerizing said resin layer and then anisotropically etching it so as to obtain the patterns of said mask.

Obviously, said mask can be made by using other materials, provided that they can be anisotropically and selectively etched with respect to the substrate.

BRIEF DESCRIPTION OF THE DRAWINGS

Other features and advantages of the invention can be gathered from the following description given in a purely illustrative and non-limitative manner with reference to the attached FIGS. 1 to 13, wherein show.

For reasons of clarity, the drawings are shown in section in the widthwise direction of the elements to be produced, it being accepted that the elements can have a random shape, which is dependent on their use. Thus, these elements can e.g. be rectilinear or, as described in EP-A-0 152 326 and EP-A-0 152 328, spiral.

FIGS. 1 to 5 show different stages of producing a resin mask 3b on a substrate 1 and used according to the invention for forming spacers.

Figure 1:
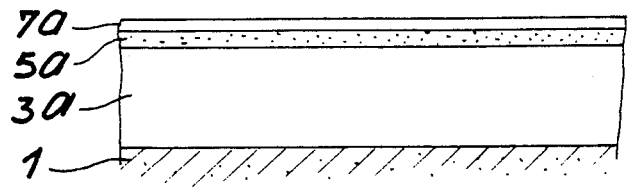
FIGS. 1 to 12 diagrammatically and in section, the main stages of producing spaced elements on a substrate in accordance with the inventive process, said elements being produced by the deposition of a first and a second material.
Figure 2:
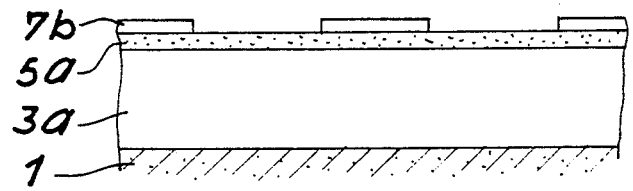
Figure 3:
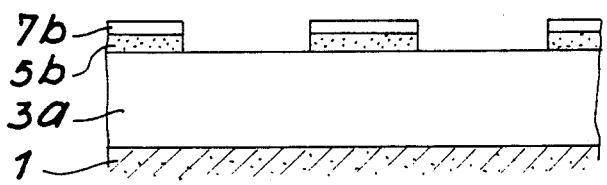

According to FIG. 1, for producing said mask, on said substrate 1 is firstly deposited a resin layer 3a with a thickness of the same order of magnitude as the height of the spacers to be produced and which is polymerized by a heat treatment. A layer 5a, e.g. of silica is then deposited, followed by a photosensitive resin layer 7a. The latter is irradiated and developed, so as to obtain a mask 7b with geometrical patterns, which are a function of the dimensions and spacing of the spacers to be produced (FIG. 2).

Thus, for example, for producing elements with a width of approximately 3 μm and spaced by approximately 0.5 μm, the spacers must have a width of approximately 0.5 μm and must be spaced by 3 μm. The patterns of mask 7b must consequently be such that the width of the parts of the resin mask 7b are approximately 3 μm and the spacing between these parts approximately 4 μm, bearing in mind the width of the spacers.

The geometrical patterns of the mask 7b are then transferred into the silica layer 5a (FIG. 3), e.g. by reactive ionic etching through mask 7b, using an etching agent having no action on the resin, such as carbon trifluoride or tetrafluoride ($CHF_3$ or $CHF_4$). In this way a second silica mask 5b is obtained.

Figure 4:
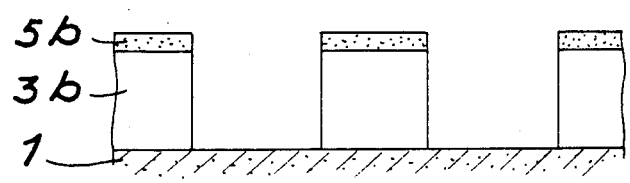

This silica mask 5b then makes it possible to etch the resin layer 3a in accordance with the same geometrical patterns, so as to obtain a mask 3b (FIG. 4). For example, layer 3a is etched through mask 5b by reactive ionic etching using an etching agent having no action on the silica, such as oxygen. Mask 7b is advantageously made from a resin, which can be etched by the same type of reactive ionic etching as resin layer 3a. In order that mask 7b is completely eliminated during the etching, the thickness of layer 7a is preferably equal to or less than the thickness of layer 3a. After this stage, only masks 3b and 5b remain on the substrate (FIG. 4).

Figure 5:
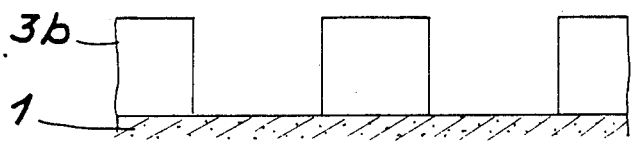
Figure 6:
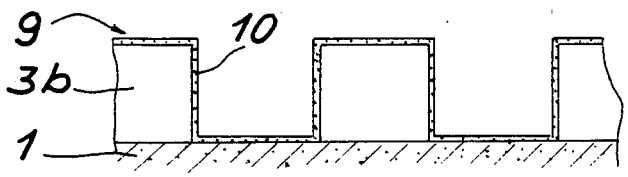
Figure 7:
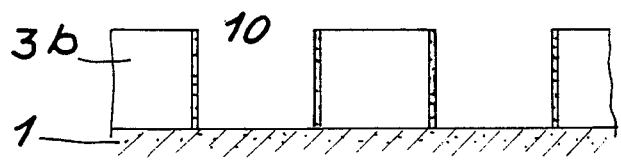
Figure 8:
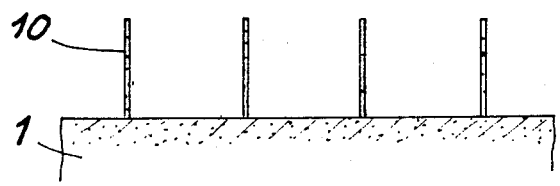

As mask 5b is no longer protected by mask 7b, it is in turn eliminated, e.g. by reactive ionic etching with carbon trifluoride or tetrafluoride, so as to only retain on the substrate the polymerized resin mask 3b (FIG. 5). As shown in FIGS. 6, 7 and 8, mask 3b makes it possible to produce spacers in accordance with the invention.

Thus, according to FIG. 6, over mask 3b is firstly deposited a layer 9 of material forming the spacers, such as silica. Deposition takes place isotropically in order to obtain a layer of uniform thickness, the latter being of the same order of magnitude as the width of the spacers to be produced.

This is followed by anisotropic etching of layer 9, e.g. by reactive ionic etching using carbon trifluoride or tetrafluoride as the etching agent in the case of a silica layer, so as to only leave those portions 10 thereof which are perpendicular to the surface of the substrate and against the walls of mask 3b (FIG. 7). The width of the remaining parts 10 of layer 9 is substantially equal to the thickness of layer 9 prior to said etching.

Mask 3b is then eliminated, e.g. by chemical etching or reactive ionic etching using oxygen as the etching agent, so as to only retain spacers 10 on the substrate (FIG. 8).

Figure 9:
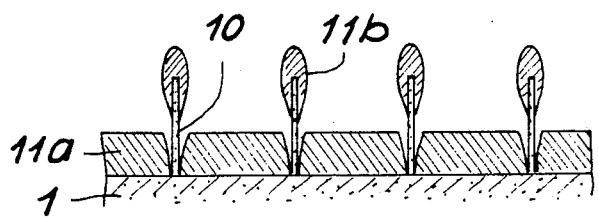

FIGS. 9, 10, 11 and 12 show the final stages making it possible to produce the elements according to the invention. Firstly anisotropic deposition of a first material takes place on the substrate from above the spacers (FIG. 9). When the elements are conductors, the first material is e.g. copper. Thus, said material is deposited both on the substrate and on the upper part of the spacers, thus respectively producing deposits 11a and 11b. Deposit 11b, produced on the head of the spacers, has an oval section and during its formation it prevents the material constituting deposit 11a from agglomerating against the walls of the spacers. Thus, as shown in FIG. 9, the walls of deposit 11a have a slope of a few degrees with respect to the vertical direction of the spacers, said slope depending on the oval shape of the section of deposit 11b produced on the spacers.

When the anisotropic deposit is inadequately directional at the start of deposition, it is possible for the first material to be deposited against the spacer walls at the base of the spacer. To permit the subsequent elimination of the spacers, the material deposited on the base thereof must be removed.

Figure 10:
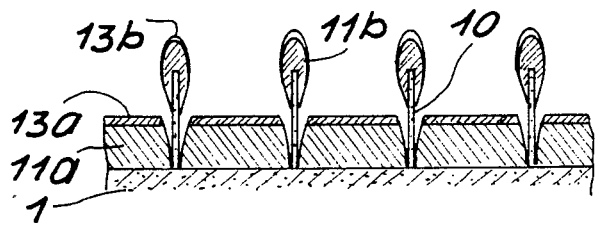
Figure 11:
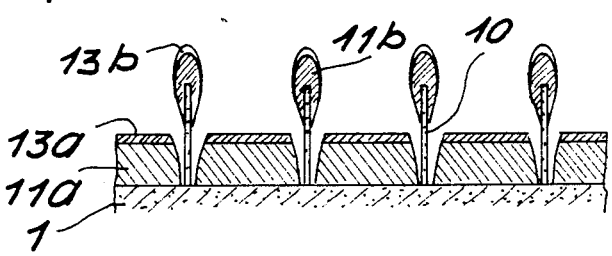

For this purpose, use is made of a variant of the inventive process, in which anisotropic deposition takes place of a second material on the first material. When the elements are conductors, the second material is e.g. chromium. This said second material is deposited on deposits 11a and 11b of the first material producing a deposit 13a above the substrate and a deposit 13b above the spacers (FIG. 10). Deposit 11b of the first material on the spacers prevents the second material from being deposited on said spacers in the vicinity of their base. Thus, the second material does not protect deposit 11a of the first material at the base of the spacers. This is followed by selective etching of the first material, by chemical etching for instance with $H_2SO_4 + CrO_3$ in the case of copper. Alternatively reactive ionic etching with a chlorine gas is possible, so as to eliminate those parts of the first material not protected by the second material, i.e. those close to the base of the spacers. Thus, as the base of the spacers is freed from the first material (FIG. 11), the spacers can be eliminated, together with the deposits 11b and 13b on the head of the spacers. The spacers can e.g. be eliminated by chemical etching with hydrofluoric acid in the case of silica spacers, deposits 11b and 13b located on the head thereof being transferred into the etching bath.

Figure 12:
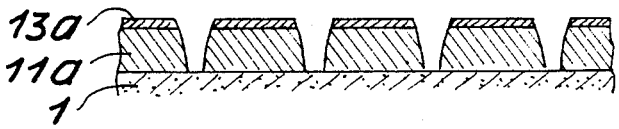

As shown in FIG. 12, after this stage all that is left on the substrate consists of the elements constituted by deposits 11a and 13a of the first and second material.

In the case of producing electric conductors, the first material is conductive, but the second material can both be conductive and insulating, the latter serving to protect the first material during its elimination from the vicinity of the base of the spacers.

Figure 13:
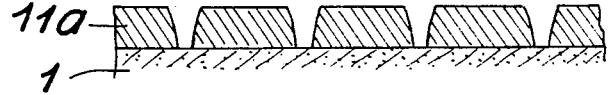
FIG. 13 diagrammatically and in section, elements constituted by a single material and produced on a substrate.

FIG. 13 shows a variant of FIG. 10, in which the elements on substrate 1 are solely constituted by a deposit 11a of the first material. The production of these elements can be obtained either by eliminating the second material deposit 13a, or by a first material deposit which is sufficiently directional for it not to be necessary to use a second material.

For example, for producing elements of width 3 $\mu$m, spaced from one another by less than 1 $\mu$m, e.g. approximately 0.5 $\mu$m and with a thickness of approximately 0.9 $\mu$m, on the substrate is deposited a 2 $\mu$m resin layer 3a, a 0.1 $\mu$m silica layer 5a and a 1 $\mu$m resin layer 7a. As described hereinbefore, from these layers are successively produced masks 7b, 5b and 3b, whereof the width of the unetched portions is approximately 3 $\mu$m and the spacing between the portions is approximately 4 $\mu$m. As only mask 3b is retained, above it is deposited an e.g. 0.5 $\mu$m thick silica layer 9 and after etching the latter and elimination of mask 3b, all that remains on the substrate are those portions 10 of layer 9 constituting the spacers. Thus, the latter have a width of 0.5 $\mu$m, a height of 2 $\mu$m and are reciprocally spaced by 3 $\mu$m. This is followed by a deposit 11a of first material on the substrate in a thickness of 0.9 $\mu$m. In the case where there is a deposit 13a of a second material, this takes place with a limited thickness of approximately 0.03 $\mu$m.

The drawings show the production of elements having an identical width, but obviously this is not limitative and said elements could also have different widths. To obtain elements of different widths, it would be sufficient to produce differently spaced spacers, i.e. to produce a mask 3b, whereby the width of the parts covering the substrate varies as a function of the desired spacing of the spacers.

As has been shown hereinbefore, the inventive process makes it possible to produce elements having a limited spacing, which makes it possible to manufacture a maximum number of elements on a substrate with a given surface area. This feature is particularly interesting for producing magnetic heads, the magnetic head quality being directly dependent on the number of turns of conductors present between the pole pieces. The production of elements with a limited spacing also makes it possible, when depositing a material layer above said elements, particularly for insulating or protecting them, to obtain a substantially planar profile, which renders a planarization stage superfluous in some applications.

Another advantage of the process of the present invention lies in the fact that the thickness of the anisotropic deposit is not limitated; it can be inferior, equal or superior to the height of the spacers and can reach several micrometers, which is difficult with the lift-off technique. Only the slope of the edges of the deposit depends on the height of the spacers. Finally, this process makes it possible to free oneself from the problems and limitations due to temperature and deposit which are specific of the processes using resin masks.

I claim:

1. Process for the production of mutually spaced elements (11a, 13a) on a substrate (1), comprising a first stage of producing on the substrate spacers (10), which are perpendicular to the substrate and whereof the dimensions and spacings are a function of the dimensions and spacings of the elements (11a, 13a) to be produced, said spacers (10) having parallel side walls and a width less than 1 micrometer, a second stage of depositing anisotropically a first material forming elements (11a) on said substrate (1) in a direction perpendicular to its surface, wherein a deposit (11b) is produced on the heads of spacers (10) which prevents the deposit of said first material on the walls of the spacers, a third stage of depositing anisotropically perpendicular to the surface of the substrate a second material on the deposited first material so that said second material covers the upper surface of the first deposited material, and, using the second material as a mask, selectively etching the first material to remove it at least from the bases of the spacers and thereafter removing the spacers.

2. Process for the production of elements (11a, 13a) on a substrate (1) according to claim 1 characterized in that the elements are conductors.

3. Process according to claim 1 or 2, characterized in that the spacers are made from silica.

4. Process according to claim 3, characterized in that the spacers are removed by etching with hydrofluoric acid.

* * * * *